(12) United States Patent
Shabra et al.

(10) Patent No.: US 8,462,033 B2
(45) Date of Patent: Jun. 11, 2013

(54) RECONFIGURABLE DELTA-SIGMA MODULATOR ADC USING NOISE COUPLING

(75) Inventors: Ayman Shabra, Woburn, MA (US); Halil Kiper, Somerville, MA (US)

(73) Assignee: Mediatek Singapore Pte. Ltd., Solaris, Singapore (SG)

( * ) Notice: Subject to any disclaimer, the term of this patent is extended or adjusted under 35 U.S.C. 154(b) by 82 days.

(21) Appl. No.: 13/188,470

(22) Filed: Jul. 22, 2011

(65) Prior Publication Data

US 2013/0021180 A1    Jan. 24, 2013

(51) Int. Cl.
*H03M 3/00*    (2006.01)
(52) U.S. Cl.
USPC .......................................... 341/143; 341/155
(58) Field of Classification Search
USPC .................. 341/143, 155, 156, 157, 166, 172
See application file for complete search history.

(56) References Cited

U.S. PATENT DOCUMENTS

| | | | | |
|---|---|---|---|---|
| 5,006,851 A | * | 4/1991 | Kaneaki et al. | 341/155 |
| 7,330,144 B2 | * | 2/2008 | Terazawa et al. | 341/157 |
| 7,424,407 B2 | | 9/2008 | Lang | |
| 2006/0038709 A1 | | 2/2006 | Lu | |
| 2010/0309032 A1 | * | 12/2010 | Uo et al. | 341/110 |
| 2011/0032132 A1 | * | 2/2011 | Lin et al. | 341/143 |

OTHER PUBLICATIONS

Pamarti S., The Effect of Noise Cross-Coupling on Time-Interleaved Delta-Sigma ADCs, IEEE Transactions on Circuits and Systems, vol. 55, issue 6, pp. 532-536, Jun. 2008.
Kyehyung Lee et al., Noise-Coupled Multi-Cell Delta-Sigma ADCs, IEEE International Symposium, pp. 249-252, May 27-30, 2007.
"International Search Report" mailed on Jun. 27, 2012 for International application No. PCT/SG2011/000297, International filing date:Aug. 29, 2011.

* cited by examiner

*Primary Examiner* — Joseph Lauture
(74) *Attorney, Agent, or Firm* — Winston Hsu; Scott Margo

(57) ABSTRACT

A reconfigurable analog-to-digital (ADC) modulator structure that includes a plurality of ADC structures being coupled to each other through their respective noise quantization transfer functions. Each ADC structure receives as input an analog signal and each ADC structure outputting a plurality of first output signals. An adder module receives the first output signals and performs addition on the first output signals and generates a second output signal. A division module receives the second output signal and performs division on the second output signal by a predetermined factor.

19 Claims, 3 Drawing Sheets

RECONFIGURABLE DELTA-SIGMA MODULATOR ADC USING NOISE COUPLING

BACKGROUND

The invention relates to the field of analog-to-digital converters (ADC), and in particular to reconfigurable delta-sigma modulator ADCs using noise coupling.

Wireless communication receivers today must support many different communication standards such as GSM, EDGE, TD-SCDMA, WCDMA, HSPA+, and LTE. This allows the wireless device to adapt to the available network resources and provide the user with the best level of service possible. This is achieved within the wireless handset hardware through the allocation of dedicated circuits for each standard or through reconfigurations of common circuits to the different standards.

One important component of the wireless receiver is the analog-to-digital converter (ADC). The function of the ADC is to digitize the received signal so it may be processed by the digital signal processing hardware or software components. The bandwidth of the input signal to the ADC will change along with the standard that is being supported. For example, 100 kHz bandwidth is required for the GSM standard, while 10 MHz is needed for LTE.

While it is possible to have dedicated ADCs for each standard this is not optimal since the integrated circuit area will increase and with it the cost. It is also possible to design an ADC for the largest input signal bandwidth and use it for smaller signal bandwidths, but this is again not optimal since the power consumption will be far from optimal for the narrow bandwidth cases and this will result in a short battery life. It is therefore desirable for the ADC to not only be reconfigurable, but also to have its power consumption scale in proportion to the bandwidth.

Of particular interest in the design of wireless receivers are delta-sigma ADC architectures. Here, numerous approaches have been use to allow for the reconfiguration of the ADC.

It is possible to change the order or the loop filter configurations. When cascaded or mash delta-sigma architectures are used, it is possible to disable blocks in the cascade, to reduce order for the lower bandwidth cases and thereby save power. For these techniques, it is not possible to achieve a reduction in power which is proportional to the bandwidth. This is because the reconfiguration involves removing components from the ADC back-end which generally are not the dominant contributors to the power consumption budget.

Another reconfiguration strategy involves modifying the clock frequency and the bias current used by the ADC components. This strategy does allow for the power consumption to scale with the signal bandwidth. It is worth noting that this requires great care to insure that the transistor and the circuit components they build remain within acceptable operating ranges. The use of PLL-based bias current generators has been proposed but this requires additional circuitry. Another point of care when changing the clock frequency is the requirements for anti-aliasing, especially when using discrete time implementations of the ADC.

The present invention offers a solution to the reconfiguration problem where the power consumption scales with the input signal bandwidth. This solution is based on the use of noise coupled delta-sigma ADCs.

SUMMARY

According to one aspect of the invention, there is provided a reconfigurable analog-to-digital (ADC) modulator structure. The reconfigurable ADC modulator structure includes a plurality of ADC structures being coupled to each other through their respective noise quantization transfer functions. Each ADC structure receives as input an analog signal and each ADC structure outputting a plurality of first output signals. An adder module receives the first output signals and performs addition on the first output signals, and generates a second output signal. A division module receives the second output signal and performs division on the second output signal by a predetermined factor.

According to another aspect of the invention, there is provided a method of arranging a reconfigurable analog-to-digital (ADC) modulator structure. The method includes coupling a plurality of ADC structures to each other through their respective noise quantization transfer functions. Each ADC structure receives as input an analog signal and each ADC structure outputting a plurality of first output signals. Also, the method includes receiving the first output signals and performing addition on the first output signals using an adder module that generates a second output signal. Furthermore, the method includes receiving the second output signal and performing division on the second output signal by a predetermined factor using a division module.

According to another aspect of the invention, there is provided a method of performing noise coupling using reconfigurable analog-to-digital (ADC) modulator structure. The method includes coupling a plurality of ADC structures to each other through their respective noise quantization transfer functions. Each ADC structure receives as input an analog signal and each ADC structure outputting a plurality of first output signals. Also, the method includes performing addition on the first output signals using an adder module that generates a second output signal. Furthermore, the method includes performing division on the second output signal by a predetermined factor using a division module.

These and other objectives of the present invention will no doubt become obvious to those of ordinary skill in the art after reading the following detailed description of the preferred embodiment that is illustrated in the various figures and drawings.

DETAILED DESCRIPTION

The invention presents a novel arrangement where a reconfigurable analog-to-digital converter modulator is provided allowing for power consumption to be scaled with the input signal bandwidth.

Figure 1:
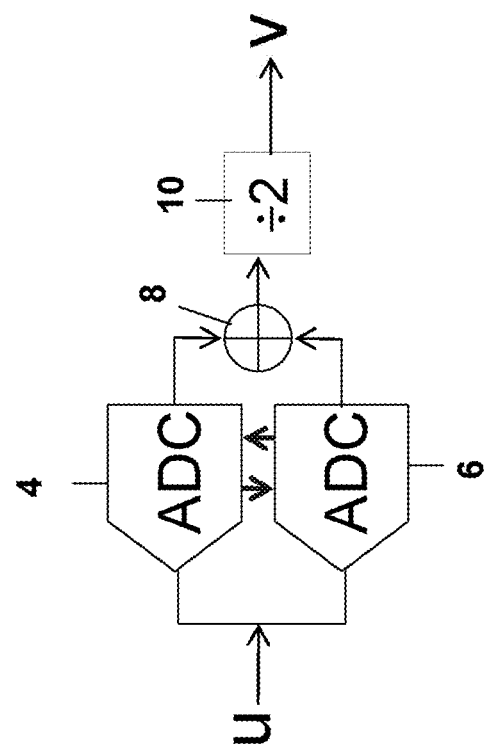
FIG. 1 is a schematic diagram illustrating a general overview of the invention.
Figure 1:

FIG. 1 is a schematic diagram illustrating the general overview of the invention. The modulator structure 2 includes a first ADC cell 4 and a second ADC cell 6, where the first ADC cell 4 and second ADC cell 6 receive an analog signal U. The first ADC cell 4 and second ADC cell 6 provide to each other noise quantization. The outputs signals V1 and V2 of the first ADC cell 4 and second ADC cell 6 are provided to an adder module 8. The output of the adder module 8 is provided to a divider module 10 that performs a division on the output of the adder module 8, which in this case is division by 2. The first and second ADC cells 4, 6 behave as noise coupled ADCs and can achieve 2 times the bandwidth while maintaining the same dynamic range. This occurs for two reasons. The first is because the thermal noise and flicker noise power density is reduced by a factor of sqrt(2)→3 dB signal to noise ratio gain but the bandwidth is increase by a factor of 2→3 dB signal to noise ratio loss. This results in an inband signal to thermal and flicker noise ratio being identical. The second is because quantization noise transfer function is modified by the factor (1−H2), where H2 is the noise quantization transfer function. It is possible to design this (1−H2) factor to achieve identical signal to quantization noise performance.

Figure 2:
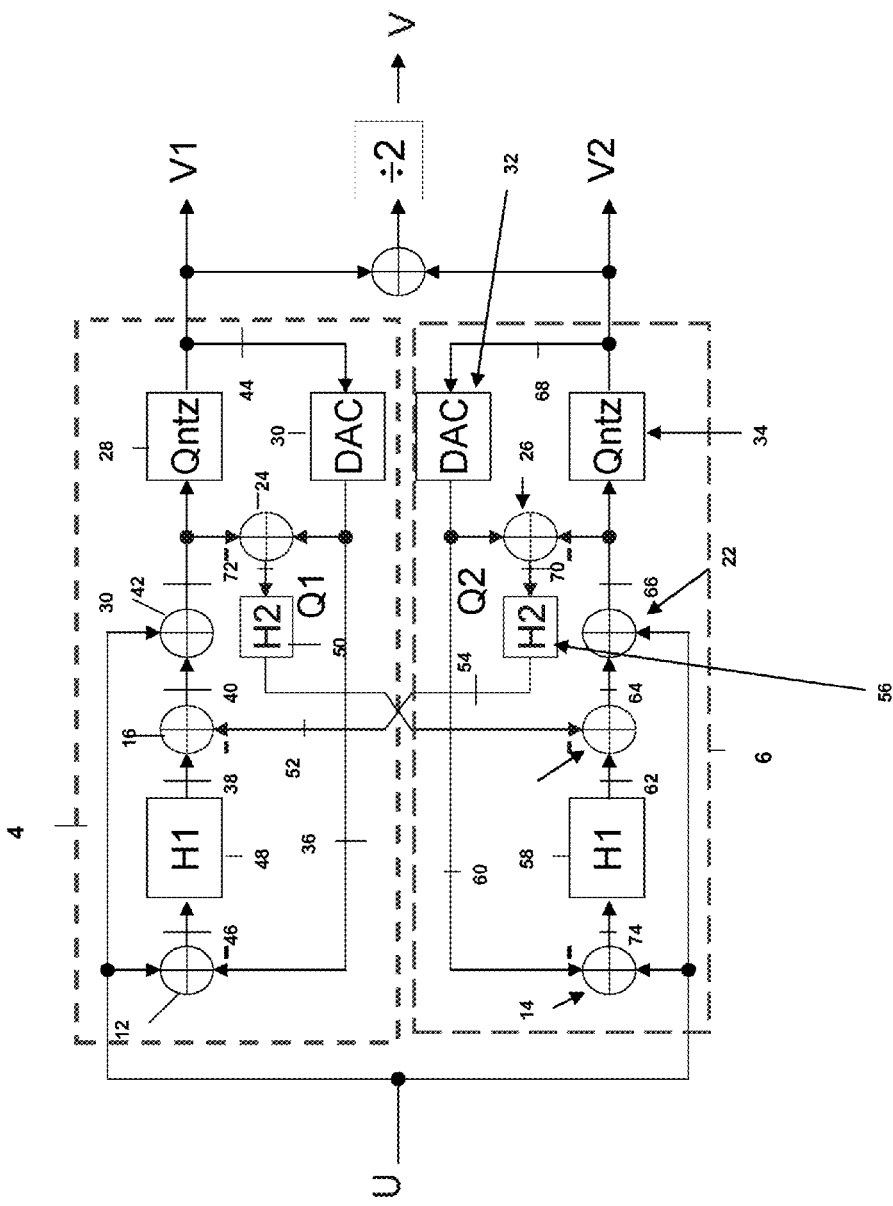
FIG. 2 is a schematic diagram illustrating the arrangements of first and second ADC cells used in accordance with the invention.

FIG. 2 is a schematic diagram illustrating the arrangements of the first and second ADC cells 4 and 6. The first ADC cell 4 and second ADC cell 6 include all the same elements and connections. The ADCs cell 4, 6 utilize the loop filter transfer 58, 48 (H1) and noise quantization transfer function 50, 56 (H2). The first ADC cell 4 includes an adder module 12 that receives as input the analog signal U and an output signal 36. The adder module 12 performs subtraction between the analog signal U and the output signal 36, and provides the results as an output signal 46. The transfer function 48 receives as input the output signal and outputs a noise signal 38. An adder module 16 performs subtraction between the noise signal 38 and a noise quantization signal 52 from a transfer function 56 from the second ADC cell 6, and outputs a signal 40. An adder module 20 performs addition between the analog signal U and the signal 40, and outputs a signal 42. A quantizer 38 receives the signal 42 and performs its respective quantization operation and outputs a signal 44. A digital-to-analog converter (DAC) 30 receives the signal 44 and converts the digital to an analog signal Q1 or signal 36. Note analog signal Q1 and signal 36 are equivalent. An adder module 24 receives the signal 36 and the signal 42 and performs subtraction between these signals, and outputs a signal 72. The quantization noise transfer function 50 receives the signal as input, and provides as an output a noise quantization signal 54.

The second ADC cell 6 includes an adder module 14 that receives as input the analog signal U and an output signal 60. The adder module 23 performs subtraction between the analog signal U and the output signal 60, and provides the results as an output signal 74. The transfer function 58 receives as input the output signal 74 and outputs a noise signal 62. An adder module 18 performs subtraction between the noise signal 62 and a noise quantization signal 54 from a transfer function 50 from the first ADC cell 4, and outputs a signal 64. An adder module 22 performs addition between the analog signal U and the signal 64, and outputs a signal 66. A quantizer 34 receives the signal 66 and performs its respective quantization operation and outputs a digital signal 68. A digital-to-analog converter (DAC) 30 receives the signal 68 and converts the digital to an analog signal Q2 or signal 60. Note analog signal Q2 and signal 60 are equivalent. An adder module 26 receives the signal 60 and the signal 66 and performs subtraction between these signals, and outputs a signal 70. The quantization noise transfer function 56 receives the signal 70 as input, and provides as an output a signal 52.

The design includes two identical ADC cells 4, 6. Each cell 4, 6 can be implemented by a wide class of delta sigma ADCs. In this particular arrangement a single loop implementation is shown where the feedforward path is composed of the transfer functions 48, 58 (H1) and the quantizers 28, 34 (Qntz), while the feedback path is composed of the digital-to-analog converters (DAC) 30, 34. The input signal U is applied to each of the two cells 4, 6 while the outputs of the two cells V1, V2 are summed using an adder module 8 to generate the total output and divided by 2 by a divider module 10. Finally, the quantization noise signal 52, 54 from each cell 4, 6 is coupled into the other. This arrangement results in an increase in the order of the modulator by (1−H2).

The output voltages V1 and V2 are defined as follows:

$$V_1 = U + \sqrt{V_{Q1}^2 + V_{C1}^2} = U + \sqrt{V_{n1}^2} = U + V_{n1} \quad \text{Eq. 1}$$

$$V_2 = U + \sqrt{V_{Q2}^2 + V_{C2}^2} = U + \sqrt{V_{n2}^2} = U + V_{n2} \quad \text{Eq. 2}$$

where VQ1 is quantization noise at ADC 4, VQ2 is quantization noise at ADC 6, Vc1 is circuit noise at ADC 4, Vc2 is circuit noise at ADC 6, Vn1 is overall noise at ADC 4, Vn2 is overall noise at ADC 6, and Vn is overall noise at the ADC output. Using Eq. 1 and Eq. 2 one can find the output voltage V of the modulator to be defined as follows:

$$V = \frac{V1 + V2}{2} = U + \frac{1}{2}\sqrt{V_{n1}^2 + V_{n2}^2} = U + \frac{V_n}{\sqrt{2}} \quad \text{Eq. 3}$$

Also, the VQ1 and VQ2 are defined as follows:

$$V_{Q1} = \frac{1}{1+H1}(Q1 - H2Q2) \quad \text{Eq. 4}$$

$$V_{Q2} = \frac{1}{1+H1}(Q2 - H2Q1) \quad \text{Eq. 5}$$

where the overall quantization VQ is defined as follows:

$$V_Q = \frac{V_{Q1} + V_{Q2}}{2} = \frac{1}{2}\left(\frac{1}{1+H1}\right)(1-H2)(Q1+Q2) \quad \text{Eq. 6}$$

$$V_Q = \left(\frac{1}{1+H1}\right)\left(\frac{(1-H2)Q}{\sqrt{2}}\right) \quad \text{Eq. 7}$$

H2 can simply be a delay ($z^{-1}-1$) to increase the modulator order by one $(1-H2)=(z^{-1}-1)$. H2 can also be a higher order transfer function so that $1-H2=(z^{-1}-1)^n$ increasing the modulator order by n. These choices result in noise transfer function zeros which are at DC. Other choices for H2 are possible which can result in complex conjugate zeros on the unit circle at frequencies other than DC (0 Hz). For example if H2 is chosen as $$H2 = \left(2 - \frac{1}{k}\right)z^{-1} - z^{-2} \quad \text{Eq. 8}$$

where k is an integer where the (1−H2) factor becomes $$1 - H2 = 1 - \left(2 - \frac{1}{k}\right)z^{-1} + z^{-2} \quad \text{Eq. 9}$$

Of course it is possible to implement H2 as an arbitrary transfer function. It is also possible to make H2 reconfigurable such that it changes depending on the input signal bandwidth. The invention provides a reconfiguration approach where the power consumption scales with the input signal bandwidth. A reconfiguration approach is used where the clock jitter requirements for the feedback DAC do not increase as the input bandwidth increases. This is because as the number of cell used increases, the effective number of feedback levels also increases. The invention allows for at least two cells to form this reconfiguration arrangement, however, other 3 or more cells can be used as well. Also, the quantization noise inputs for each cell can be configured to come from the quantization noise output of the preceding cell. The invention is achieved by selectively enabling the number of cells in proportion to the desired bandwidth.

Figure 3:
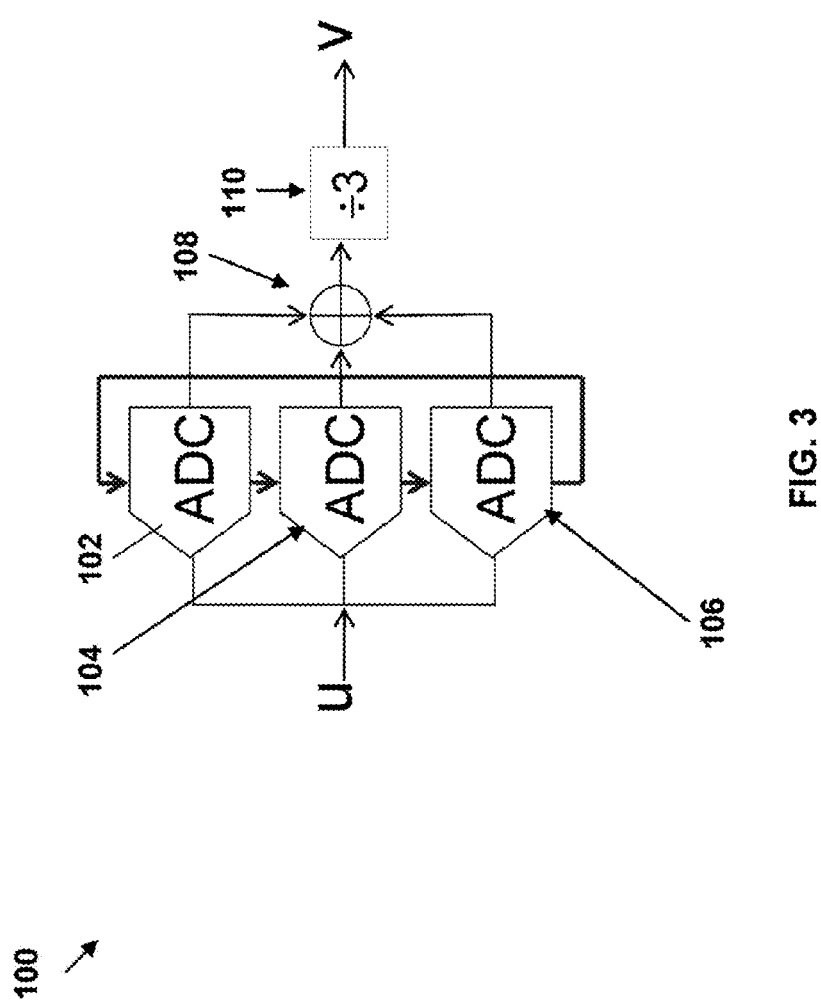
FIG. 3 is a schematic diagram illustrating another embodiment of the invention where three ADCs are used to form a reconfigurable modulator ADC using noise coupling.

FIG. 3 is a schematic diagram illustrating another embodiment of the invention where three ADCs are used to form reconfigurable modulator ADC 100 using noise coupling. The modulator ADC 100 includes a first ADC, a second ADC, and a third ADC, where each of the ADCs receives as input the analog signal U. The outputs of each of the ADCs are provided to an adder module 108 that performs addition of these signals and send its input to a divider module 110. The divider module 110 divides its input by 3 and its outputs the voltage V, which is defined to be the output of the modulator ADC 100. Quantization noise inputs 112, 114, 116 for each cell 102, 104, 106 can be configured to come from the quantization noise output of the preceding enabled cell. In this arrangement, the noise power density has reduced by a factor of sqrt(3) as well as the bandwidth has increased by a factor of 3. Again, the same signal to noise ratio has been maintained.

The invention allows the implementation of each cell to be a delta sigma ADC with any topology that allows for the input of the quantizer to the measured. This allows for the use of all delta sigma topologies with the exception of VCO based quantizers. The use of single loop designs would be preferable to cascaded or mash implementation due to its relative insensitivity to global component variations. The implementation of the delta sigma ADC can be discrete time or continuous time. Discrete time implementations have better jitter insensitivity while continuous-time provide inherent anti-aliasing. The quantization noise coupling transfer function H2 can be chosen to be full clock cycle delay, and can be chosen to produce at direct current or complex conjugate zeros on the unit circle at frequencies other than direct current. Moreover, the invention allows quantization noise coupling transfer function H2 to be defined as $(2-1/k)z^{-1}-z^{-2}$ where k is an integer to produce complex conjugate zeros on the unit circle.

The invention can be used in a multi-mode ADC design supporting GSM, WCDMA, and LTE standards. Furthermore, the invention can be used in any ADC that requires re-configurability using the same circuitry for a number of standards requiring varying ADC bandwidths.

Although the present invention has been shown and described with respect to several preferred embodiments thereof, various changes, omissions and additions to the form and detail thereof, may be made therein, without departing from the spirit and scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfigurable analog-to-digital (ADC) modulator structure comprising:
   a plurality of ADC structures being coupled to each other through their respective noise quantization transfer functions, each ADC structure receiving as input an analog signal, and each ADC structure outputting a plurality of first output signals, wherein the ADC structures are arranged so that each ADC structure sends to another ADC structure their respective noise quantization output signal;
   an adder module that receives the first output signals and performs addition on the first output signals, and generates a second output signal; and
   a division module that receives the second output signal and performs division on the second output signal by a predetermined factor.

2. The reconfigurable ADC modulator structure of claim 1, wherein the ADC structures comprise delta-sigma ADC structures.

3. The reconfigurable ADC modulator structure of claim 1, wherein the delta sigma ADC structures comprise discrete time or continuous time implementations.

4. A method of arranging a reconfigurable analog-to-digital (ADC) modulator structure comprising:
   coupling a plurality of ADC structures to each other through their respective noise quantization transfer functions, each ADC structure receiving as input an analog signal and each ADC structure outputting a plurality of first output signals, wherein the ADC structures are arranged so that each ADC structure sends to another ADC structure their respective noise quantization output signal;
   receiving the first output signals and performing addition on the first output signals using an adder module that generates a second output signal; and
   receiving the second output signal and performing division on the second output signal by a predetermined factor using a division module.

5. The method of claim 4, wherein the ADC structures comprise delta-sigma ADC structures.

6. The method of claim 4, wherein the delta sigma ADC structures comprises discrete time or continuous time implementations.

7. A method of performing noise coupling using reconfigurable analog-to-digital (ADC) modulator structure comprising:
   coupling a plurality of ADC structures to each other through their respective noise quantization transfer functions, each ADC structure receiving as input an analog signal and each ADC structure outputting a plurality of first output signals;
   performing addition on the first output signals using an adder module that generates a second output signal; and
   performing division on the second output signal by a predetermined factor using a division module;
   wherein each ADC structure sends to another ADC structure their respective noise quantization output signal.

8. A reconfigurable analog-to-digital (ADC) modulator structure comprising:
   a plurality of ADC structures being coupled to each other through their respective noise quantization transfer functions, each ADC structure receiving as input an analog signal, and each ADC structure outputting a plurality of first output signals, wherein the ADC structures are arranged so that each ADC structure comprises a feedforward path having a first transfer function and a quantizer;
   an adder module that receives the first output signals and performs addition on the first output signals, and generates a second output signal; and
   a division module that receives the second output signal and performs division on the second output signal by a predetermined factor.

9. The reconfigurable ADC modulator structure of claim 8, wherein the ADC structures are arranged so that each ADC structure comprises a feedback path having a digital-to-analog converter (DAC).

10. A reconfigurable analog-to-digital (ADC) modulator structure comprising:
a plurality of ADC structures being coupled to each other through their respective noise quantization transfer functions, each ADC structure receiving as input an analog signal, and each ADC structure outputting a plurality of first output signals, wherein the ADC structures are arranged so that there is an increase in quantization noise suppression by a factor of (1−H2), where H2 is the noise quantization transfer factor of each of the ADC structure noise quantization transfer function;
an adder module that receives the first output signals and performs addition on the first output signals, and generates a second output signal; and
a division module that receives the second output signal and performs division on the second output signal by a predetermined factor.

11. The reconfigurable ADC modulator structure of claim 10, wherein the noise quantization transfer function comprises full clock delay.

12. The reconfigurable ADC modulator structure of claim 11, wherein the noise quantization transfer function comprises zeros at direct current.

13. The reconfigurable ADC modulator structure of claim 11, wherein the noise quantization transfer function comprises complex conjugate zeros on the unit circle at frequencies other than direct current.

14. A method of arranging a reconfigurable analog-to-digital (ADC) modulator structure comprising:
coupling a plurality of ADC structures to each other through their respective noise quantization transfer functions, each ADC structure receiving as input an analog signal and each ADC structure outputting a plurality of first output signals, wherein the ADC structures are arranged so that each ADC structure comprises a feedforward path having a first transfer function and a quantizer;
receiving the first output signals and performing addition on the first output signals using an adder module that generates a second output signal; and
receiving the second output signal and performing division on the second output signal by a predetermined factor using a division module.

15. The method of claim 14, wherein the ADC structures are arranged so that each ADC structure comprises a feedback path having a digital-to-analog converter (DAC).

16. A method of arranging a reconfigurable analog-to-digital (ADC) modulator structure comprising:
coupling a plurality of ADC structures to each other through their respective noise quantization transfer functions, each ADC structure receiving as input an analog signal and each ADC structure outputting a plurality of first output signals, wherein the ADC structures are arranged so that there is an increase in quantization noise suppression by a factor of (1−H2), where H2 is the noise quantization transfer factor of each of the ADC structure noise quantization transfer function;
receiving the first output signals and performing addition on the first output signals using an adder module that generates a second output signal; and
receiving the second output signal and performing division on the second output signal by a predetermined factor using a division module.

17. The method of claim 16, wherein the noise quantization transfer function comprises full clock.

18. The method of claim 17, wherein the noise quantization transfer function comprises zeros at direct current.

19. The method of claim 17, wherein the noise quantization transfer function comprises complex conjugate zeros on the unit circle at frequencies other than direct current.

* * * * *